(12) United States Patent
Chen et al.

(10) Patent No.: US 9,379,069 B2
(45) Date of Patent: Jun. 28, 2016

(54) SEMICONDUCTOR ARRANGEMENT COMPRISING TRANSMISSION LINE SURROUNDED BY MAGNETIC LAYER

(71) Applicant: Taiwan Semiconductor Manufacturing Company Limited, Hsin-Chu (TW)

(72) Inventors: Huan-Neng Chen, Taichung (TW); Jun-De Jin, Hsinchu (TW); Shuo-Mao Chen, New Taipei (TW); Chewn-Pu Jou, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/261,473

(22) Filed: Apr. 25, 2014

(65) Prior Publication Data

US 2015/0311160 A1    Oct. 29, 2015

(51) Int. Cl.
| | | |
|---|---|---|
| *H01L 29/40* | (2006.01) | |
| *H01L 23/66* | (2006.01) | |
| *H01L 21/768* | (2006.01) | |
| *H01L 23/522* | (2006.01) | |

(52) U.S. Cl.
CPC .......... *H01L 23/66* (2013.01); *H01L 21/76879* (2013.01); *H01L 21/76883* (2013.01); *H01L 23/5227* (2013.01); *H01L 2223/6611* (2013.01)

(58) Field of Classification Search
CPC ......... H01L 23/66; H01L 24/10; H01L 24/13; H01L 2924/351; H01L 2924/014; H01L 2223/6622; H01L 23/53238; H01L 21/76879; H01L 21/76883; H01L 21/76898; H01L 21/84; H05K 1/0221
USPC ............................................... 257/664; 438/3
See application file for complete search history.

(56) References Cited

U.S. PATENT DOCUMENTS

| | | | | |
|---|---|---|---|---|
| 6,302,732 | B1 * | 10/2001 | Budman .............. | H01R 9/0515 439/581 |
| 6,388,198 | B1 * | 5/2002 | Bertin ............... | H01L 21/76898 174/251 |
| 2014/0110147 | A1 * | 4/2014 | Elie ...................... | H01B 7/0009 174/107 |
| 2015/0195961 | A1 * | 7/2015 | Yanagihara .......... | H05K 9/0081 174/350 |

* cited by examiner

*Primary Examiner* — Dung Le
(74) *Attorney, Agent, or Firm* — Cooper Legal Group, LLC

(57) ABSTRACT

A semiconductor arrangement is provided. The semiconductor arrangement includes a first dielectric layer surrounding a first transmission line and a magnetic layer surrounding the first dielectric layer. The magnetic layer increases the inductance of the transmission line. The semiconductor arrangement having the magnetic layer surrounding the first transmission line has increased impedance, which promotes current flow through the transmission line, without having increased resistance as compared to a semiconductor arrangement that does not have a magnetic layer. Increased resistance requires increased power, which results in a shorter semiconductor arrangement life span than the semiconductor arrangement without the increased resistance.

20 Claims, 11 Drawing Sheets

SEMICONDUCTOR ARRANGEMENT COMPRISING TRANSMISSION LINE SURROUNDED BY MAGNETIC LAYER

BACKGROUND

In semiconductor arrangements various layers of conductive material are separated from one another by dielectric or non-conductive layers. Electrically conductive vias are formed within or through the dielectric layers to selectively connect different conductive layers to one another.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
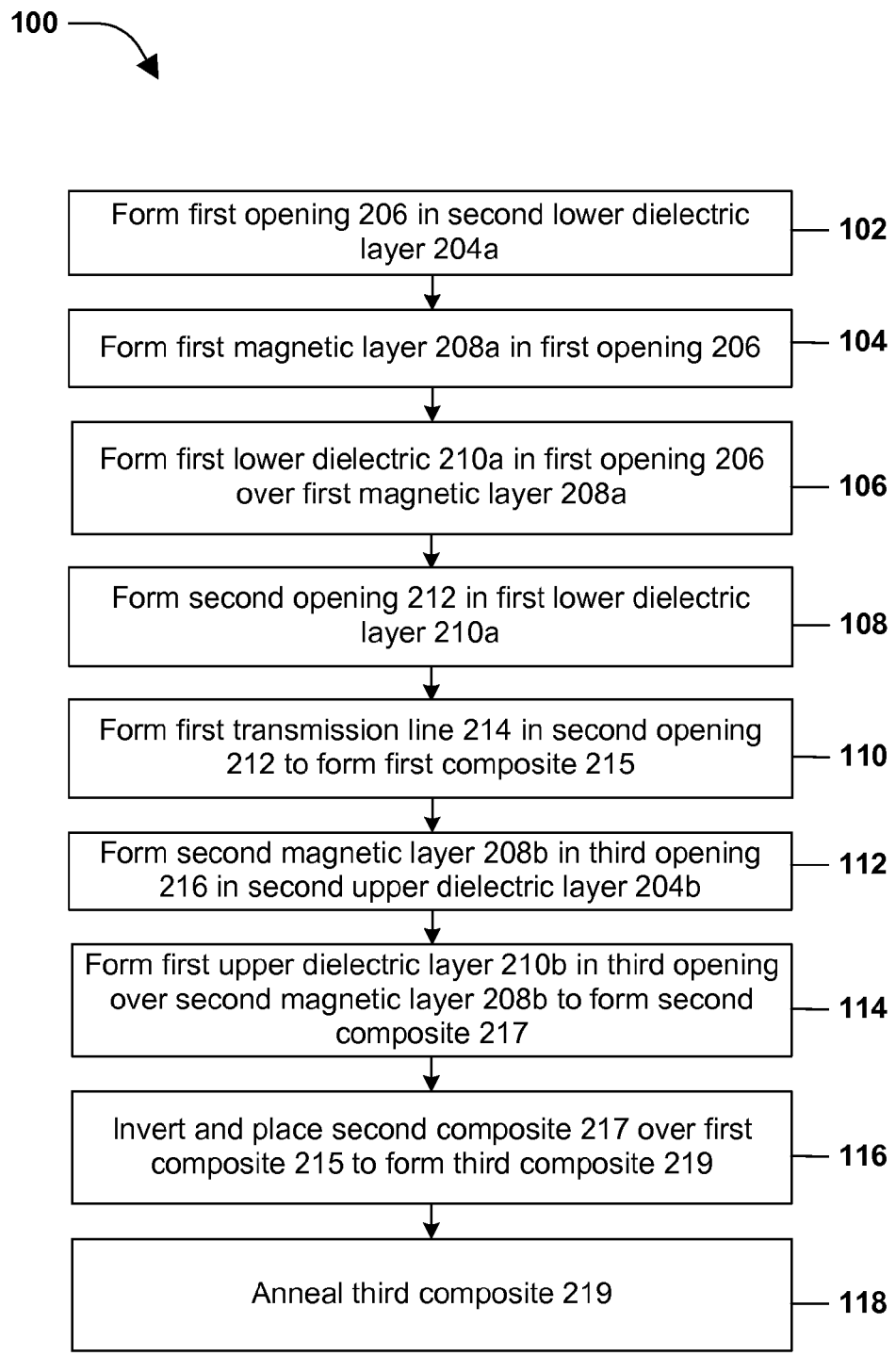
FIG. 1 is a flow diagram illustrating a method of forming a semiconductor arrangement, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor arrangement and resulting structures formed thereby are provided herein.

Figure 9:
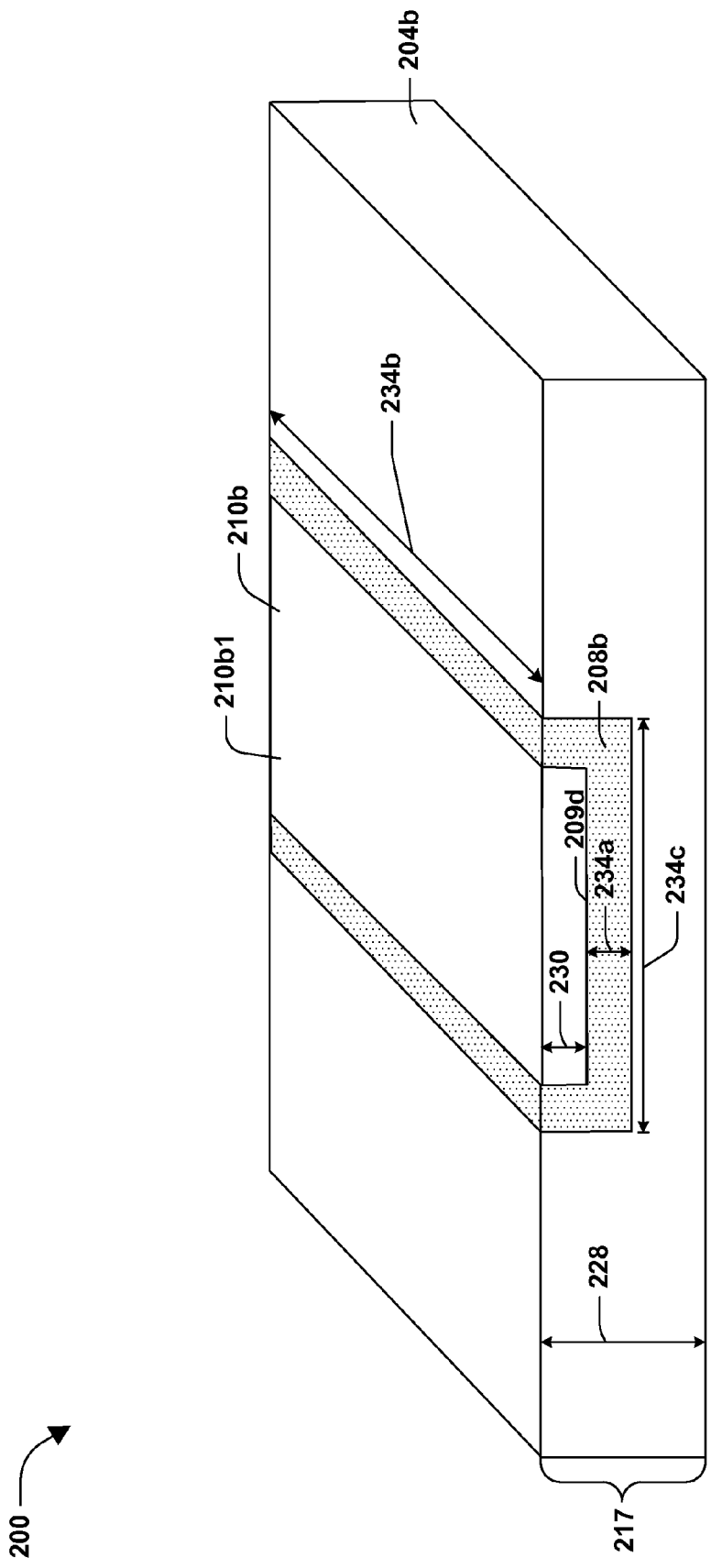
FIG. 9 is an illustration of a semiconductor arrangement, in accordance with some embodiments.
Figure 10:
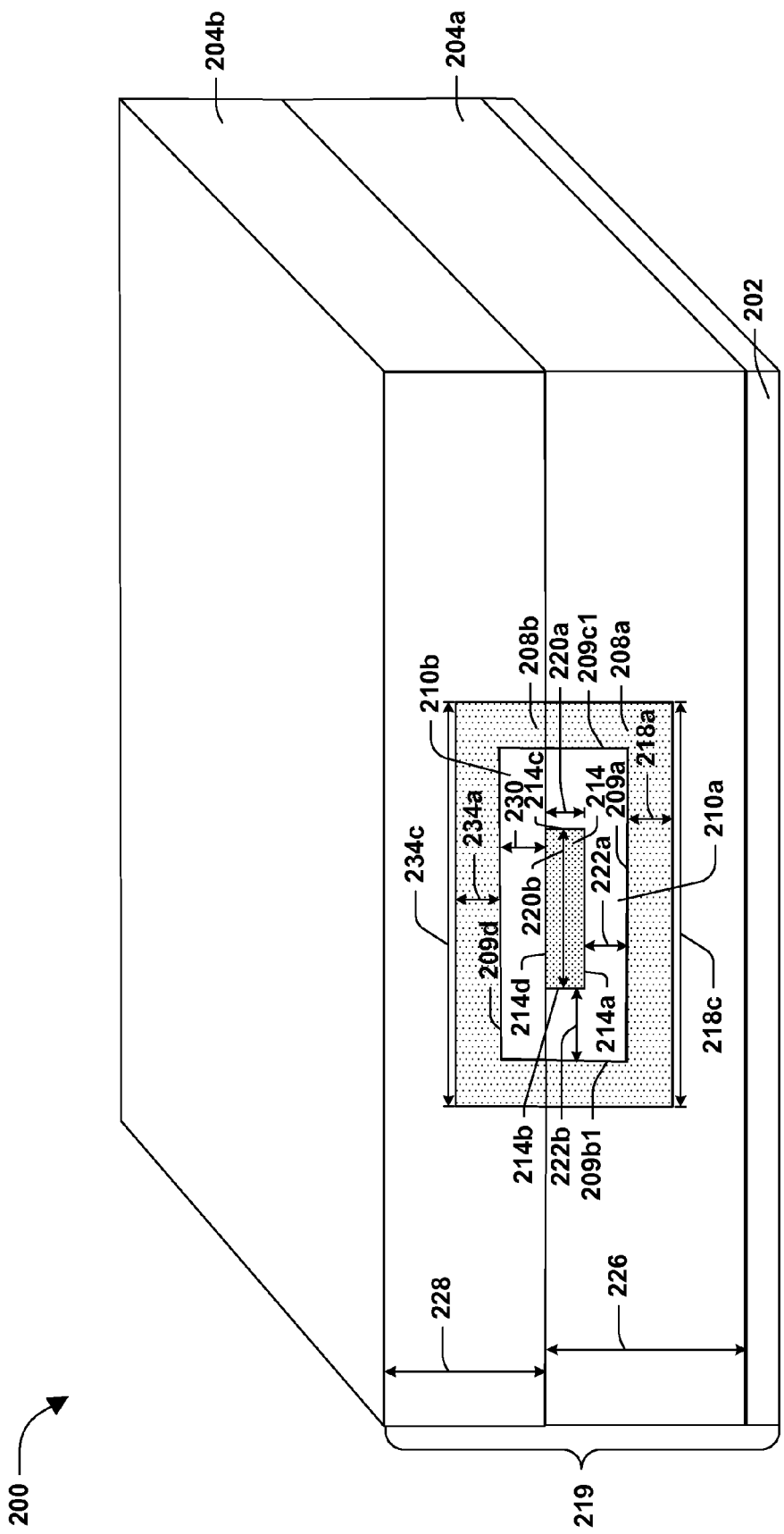
FIG. 10 is an illustration of a semiconductor arrangement, in accordance with some embodiments.
Figure 11:
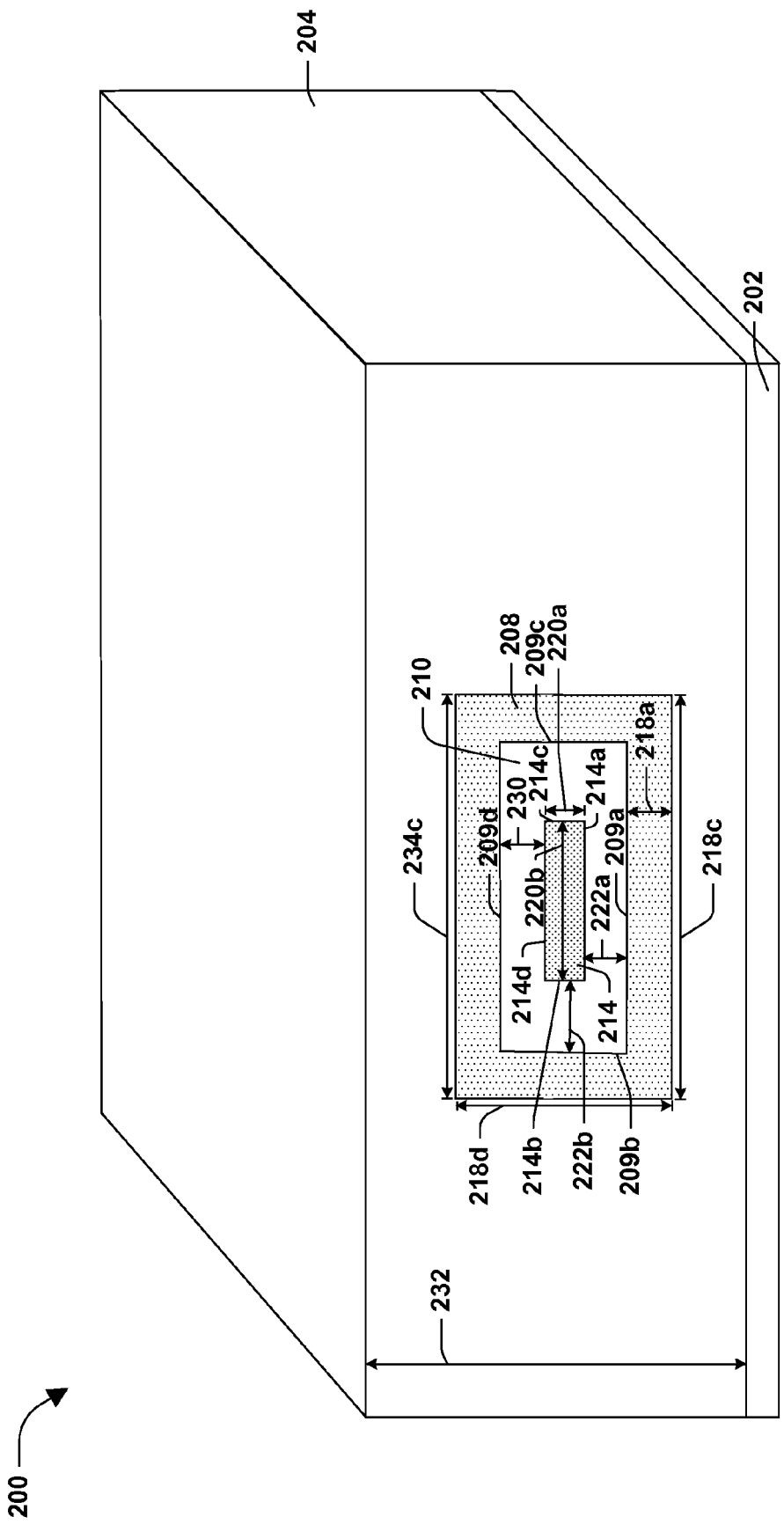
FIG. 11 is an illustration of a semiconductor arrangement, in accordance with some embodiments.

A method 100 of forming a semiconductor arrangement 200 is illustrated in FIG. 1, and one or more semiconductor arrangements formed by such methodology are illustrated in FIGS. 2-11. In some embodiments, such as illustrated in FIG. 11, a first transmission line 214 is surrounded by a first dielectric layer 210. In some embodiments, a magnetic layer 208 surrounds the first dielectric layer 210. In some embodiments, the magnetic layer 208 comprises nickel. In some embodiments, the magnetic layer 208 surrounds the first transmission line 214, such that the first transmission line 214 is substantially equidistant from a first sidewall 209b of the magnetic layer 208, a second sidewall 209c of the magnetic layer 208, a top wall 209d of the magnetic layer 208 and a bottom wall 209a of the magnetic layer 208. In some embodiments, a second dielectric layer 204 surrounds the magnetic layer 208. In some embodiments, the magnetic layer 208 is dimensioned relative to at least one of the first transmission line 214 or the first dielectric layer 210 to increase an inductance of the first transmission line 214 by a factor greater than 1. In some embodiments, increasing the inductance increases an impedance of the first transmission line 214. In some embodiments, the increased impedance occurs according to equation (1) below.

$$Z_o = \sqrt{\frac{j\omega L + R}{j\omega C + G}} \tag{1}$$

In equation (1), $Z_o$ is the impedance of the first transmission line 214, j is an imaginary unit, $\omega$ is a function of a current applied to the first transmission line 214, L is the inductance due to a magnetic field surrounding the first transmission line 214, R is a resistance of the first transmission line 214, C is the capacitance across the first transmission line 214, the first dielectric layer 210 and the magnetic layer 208 and G is a conductance of the first dielectric layer 210 separating the first transmission line 214 from the magnetic layer 208. According to equation (1), the impedance ($Z_o$) is increased by increasing at least one of the inductance (L) or the resistance (R). In some embodiments, the addition of the magnetic layer 208 increases the impedance ($Z_o$) by increasing the inductance (L) without increasing the resistance (R). In some embodiments, increasing a distances between the first transmission line 214 and a substrate 202, such as where the substrate 202 comprises ground, increases the impedance ($Z_o$) by increasing the inductance (L) without increasing the resistance (R). In some embodiments, the resistance (R) is increased by decreasing a first transmission line height 220a of the first transmission line 214. In some embodiments, the semiconductor arrangement 200 having the magnetic layer 208 surrounding the first transmission line 214 has increased impedance ($Z_o$) without having increased resistance (R), as compared to a semiconductor arrangement that does not have a magnetic layer. In some embodiments, increased resistance (R) requires increased current or power, which results in a shorter semiconductor arrangement life span than the semiconductor arrangement 200 without the increased resistance.

Figure 2:
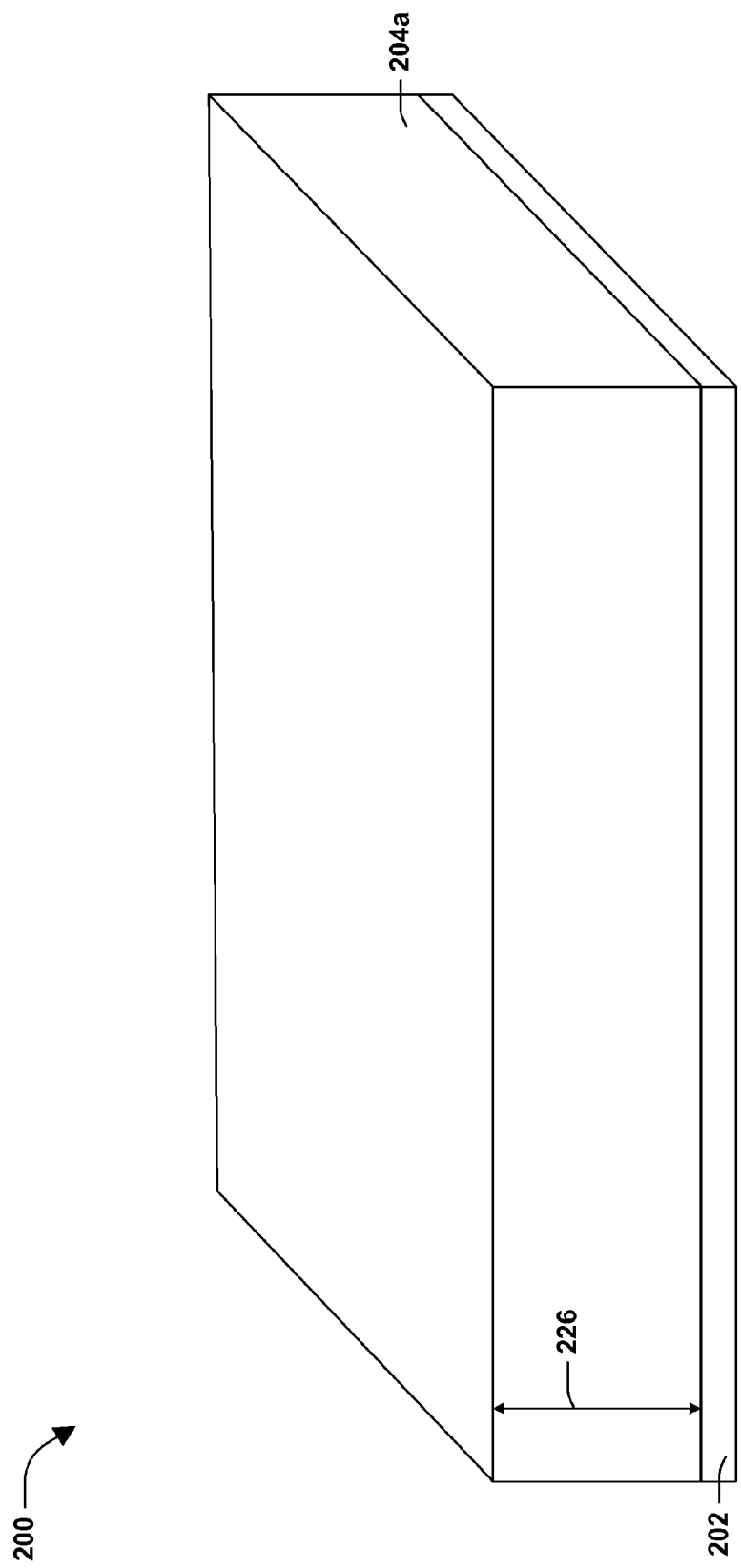
FIG. 2 is an illustration of a semiconductor arrangement, in accordance with some embodiments.
Figure 3:
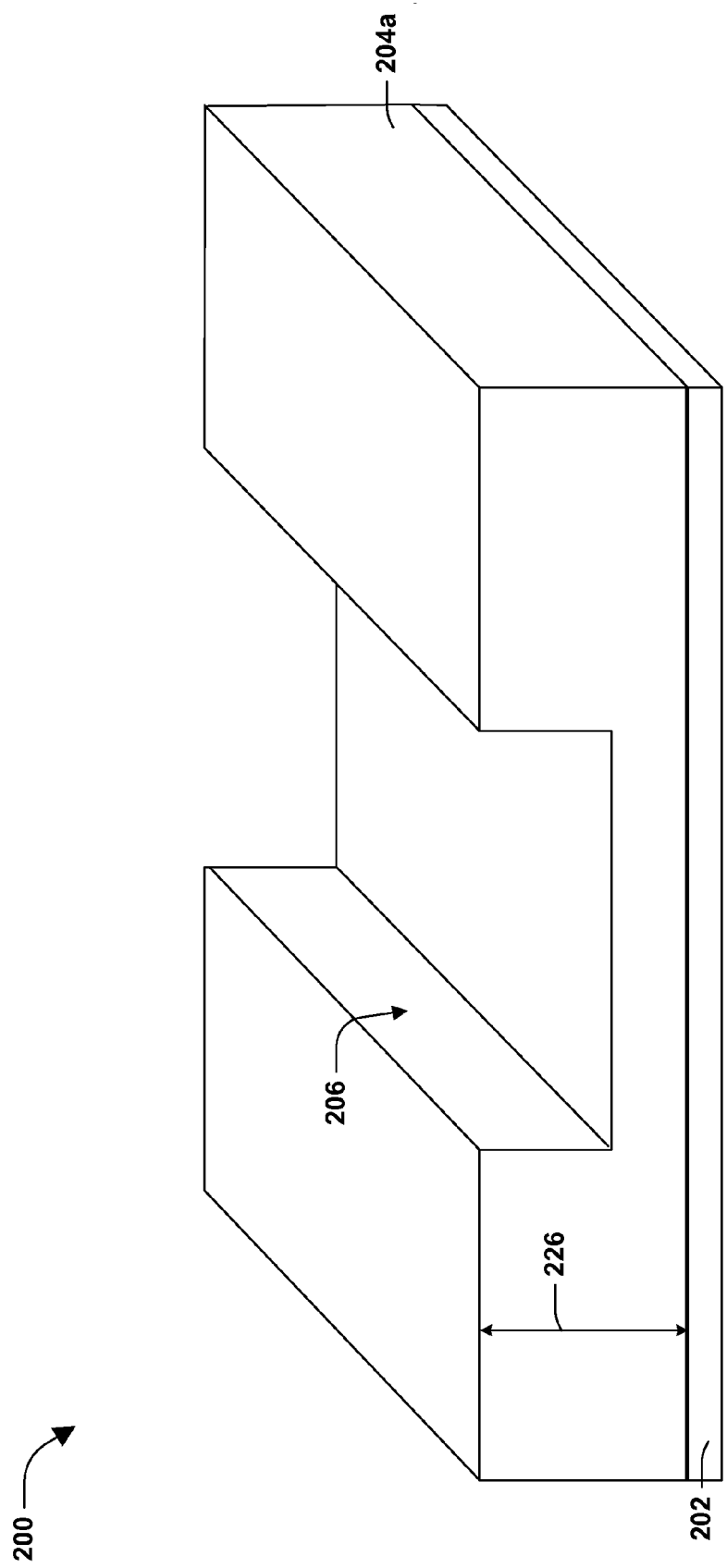
FIG. 3 is an illustration of a semiconductor arrangement, in accordance with some embodiments.

At 102 of method 100, as illustrated in FIG. 3, a first opening 206 is formed in a second lower dielectric layer 204a, according to some embodiments. Turning to FIG. 2, prior to FIG. 3, the second lower dielectric layer 204a is over the substrate 202. According to some embodiments, the substrate 202 comprises at least one of an epitaxial layer, a silicon-on-insulator (SOI) structure, a wafer, or a die formed from a wafer. In some embodiments, the substrate 202 comprises metal. In some embodiments, the substrate 202 comprises silicon. In some embodiments, the substrate 202 has a reference voltage bias, such as ground. In some embodiments, the second lower dielectric layer 204a has a dielectric constant less than 4. In some embodiments, the second lower dielectric layer 204a comprises at least one of a nitride or an oxide. In some embodiments, the second lower dielectric layer 204a has a second lower dielectric layer height 226 between about 100 µm to about 500 µm. Turning to FIG. 3, the first opening 206 is formed in the second lower dielectric layer 204a, such as by etching. Although the first opening 206 is illustrated as rectangular, the first opening 206 having different shapes, such as square, oval, or other shape is contemplated.

Figure 4:
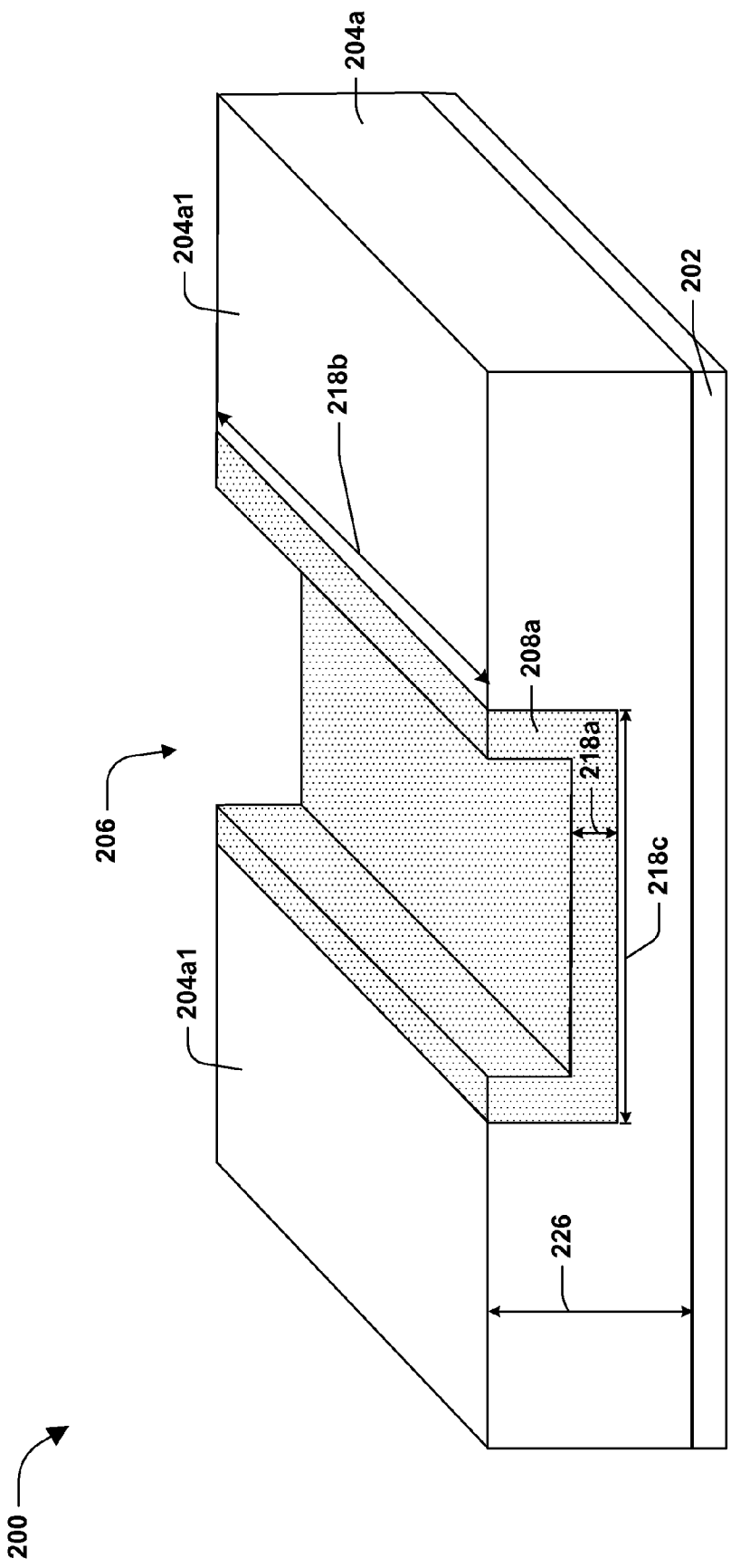
FIG. 4 is an illustration of a semiconductor arrangement, in accordance with some embodiments.

At 104 of method 100, as illustrated in FIG. 4, a first magnetic layer 208a is formed in the first opening 206, according to some embodiments. In some embodiments, the first magnetic layer 208a comprises nickel. In some embodiments, the first magnetic layer 208a has a first magnetic layer thickness 218a between about 5 µm to about 25 µm. In some embodiments, the first magnetic layer 208a has a first magnetic layer width 218c between about 10 µm to about 300 µm. In some embodiments, the first magnetic layer 208a has a first magnetic layer length 218b. In some embodiments, the first magnetic layer 208a is formed by deposition, such as at least one of atomic layer deposition (ALD), chemical vapor deposition (CVD) or physical vapor deposition (PVD). In some embodiments, the first magnetic layer 208a is formed conformally within the first opening 206. In some embodiments, a portion of the first magnetic layer 208a on a top surface 204a1 of the second lower dielectric layer 204a, is removed, such as by chemical mechanical planarization (CMP).

Figure 5:
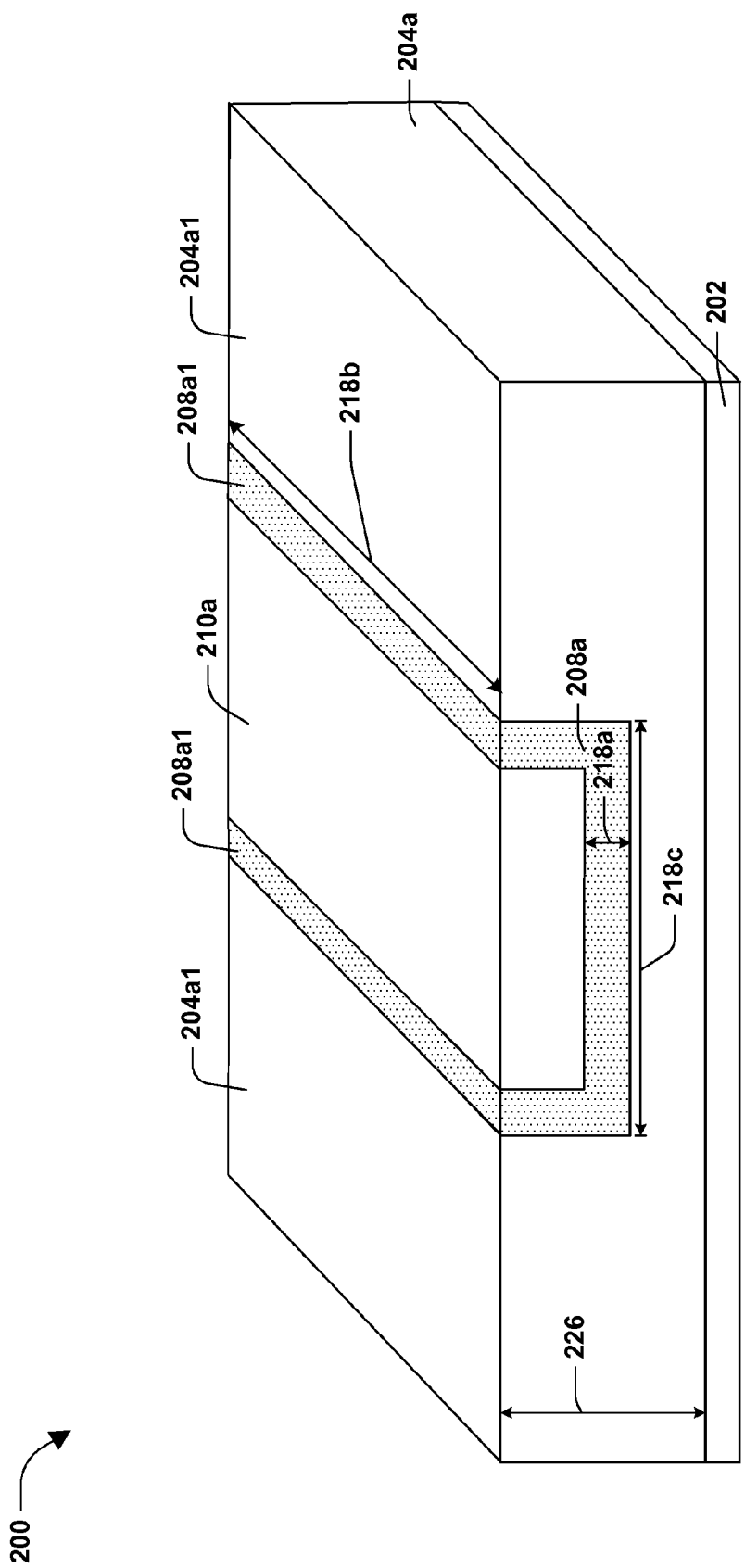
FIG. 5 is an illustration of a semiconductor arrangement, in accordance with some embodiments.

At 106 of method 100, as illustrated in FIG. 5, a first lower dielectric layer 210a is formed in the first opening 206 over the first magnetic layer 208a, according to some embodiments. In some embodiments, the first lower dielectric layer 210a comprises at least one of a nitride or an oxide. In some embodiments, the first lower dielectric layer 210a has a dielectric constant less than 4. In some embodiments, the first lower dielectric layer 210a is formed by deposition. In some embodiments, a portion of the first lower dielectric layer 210a on a top surface 208a1 of the first magnetic layer 208a or on the top surface 204a1 of the second lower dielectric layer 204a, is removed, such as by CMP.

Figure 6:
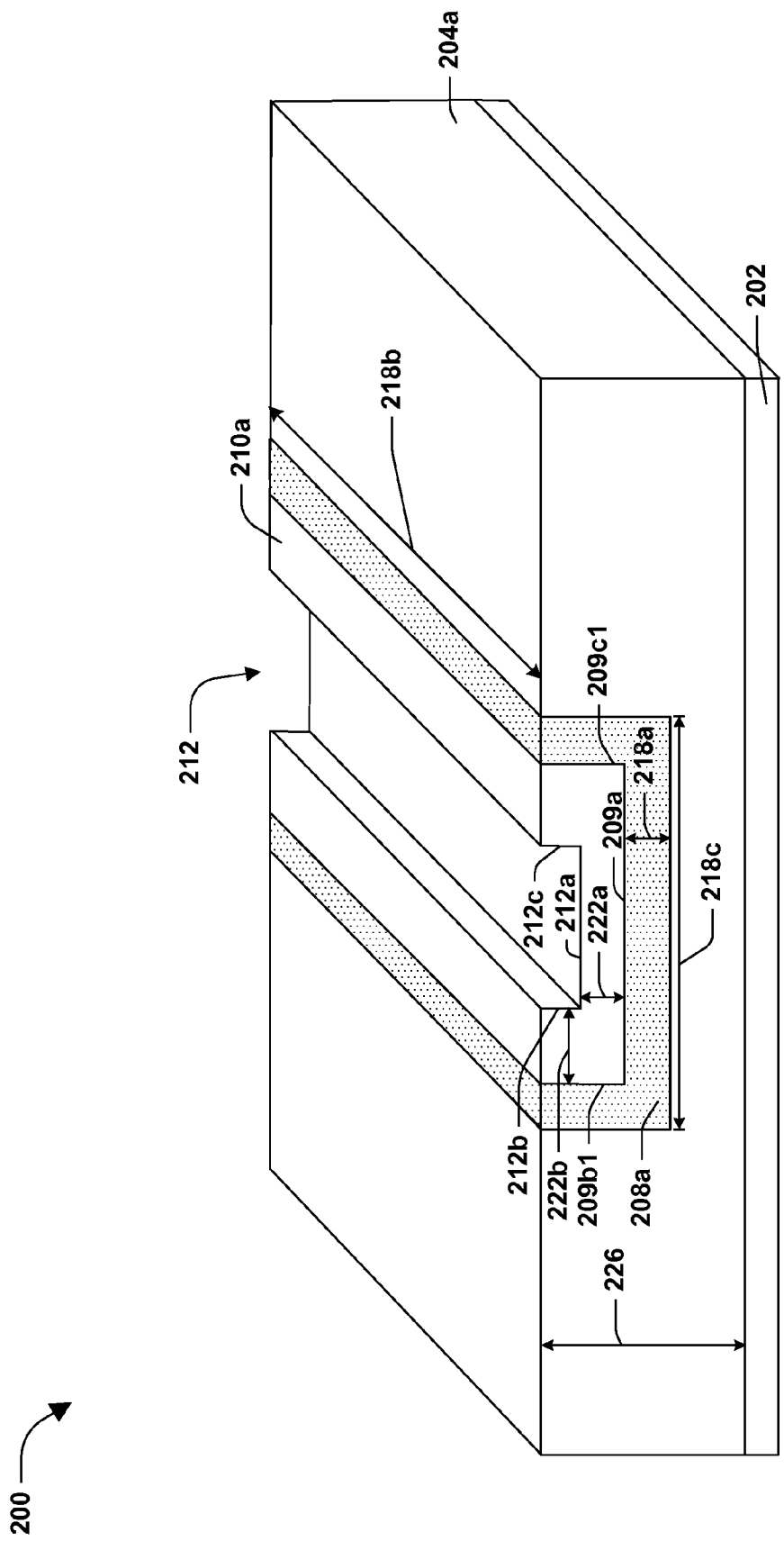
FIG. 6 is an illustration of a semiconductor arrangement, in accordance with some embodiments.

At 108 of method 100, as illustrated in FIG. 6, a second opening 212 is formed in the first lower dielectric layer 210a, according to some embodiments. In some embodiments, the second opening 212 is formed by etching. In some embodiments, the second opening 212 has a second opening bottom surface 212a a first lower dielectric layer distance 222a from the bottom wall 209a of the first magnetic layer 208a. In some embodiments, the second opening 212 has a first second opening sidewall 212b a second lower dielectric layer distance 222b from a first lower magnetic layer sidewall 209b1 of the first magnetic layer 208a. In some embodiments, the second opening 212 has a second second opening sidewall 212c a third lower dielectric layer distance (not shown) from a second lower magnetic layer sidewall 209c1 of the first magnetic layer 208a. In some embodiments, the first lower dielectric layer distance 222a is substantially equal to at least one of the second lower dielectric layer distance 222b or the third lower dielectric layer distance (not shown).

Figure 7:
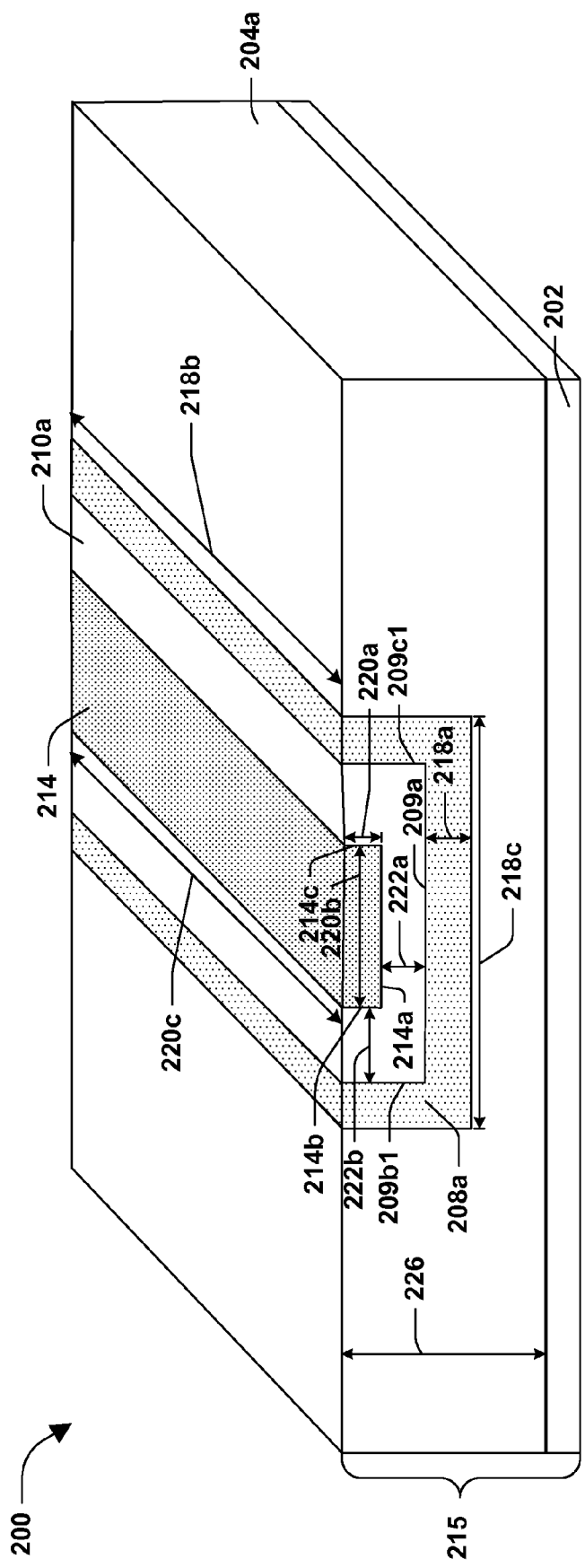
FIG. 7 is an illustration of a semiconductor arrangement, in accordance with some embodiments.

At 110 of method 100, as illustrated in FIG. 7, the first transmission line 214 is formed in the second opening 212, to form a first composite 215, according to some embodiments. In some embodiments, the first composite 215 comprises the substrate 202, the second lower dielectric layer 204a, the first magnetic layer 208a, the first lower dielectric layer 210a and the first transmission line 214. In some embodiments, the first transmission line 214 comprises copper. In some embodiments, the first transmission line 214 is formed by at least one of ALD, CVD or PVD. In some embodiments, the first transmission line 214 has the first transmission line height 220a between about 5 µm to about 100 µm. In some embodiments, the first transmission line 214 has a first transmission line width 220b between about 5 µm to about 100 µm. In some embodiments, the first magnetic layer width 218c is about 1.2 times to about 3 times the first transmission line width 220b. In some embodiments, the first transmission line 214 has a first transmission line length 220c that is substantially equal to the first magnetic layer length 218b. In some embodiments, a bottom surface 214a of the first transmission line 214 is the first lower dielectric layer distance 222a from the bottom wall 209a of the first magnetic layer 208a. In some embodiments, a first sidewall 214b of the first transmission line 214 is the second lower dielectric layer distance 222b from the first lower magnetic layer sidewall 209b1 of the first magnetic layer 208a. In some embodiments, a second sidewall 214c of the first transmission line 214 is the third lower dielectric layer distance (not shown) from the second lower magnetic layer sidewall 209c1 of the first magnetic layer 208a.

Figure 8:
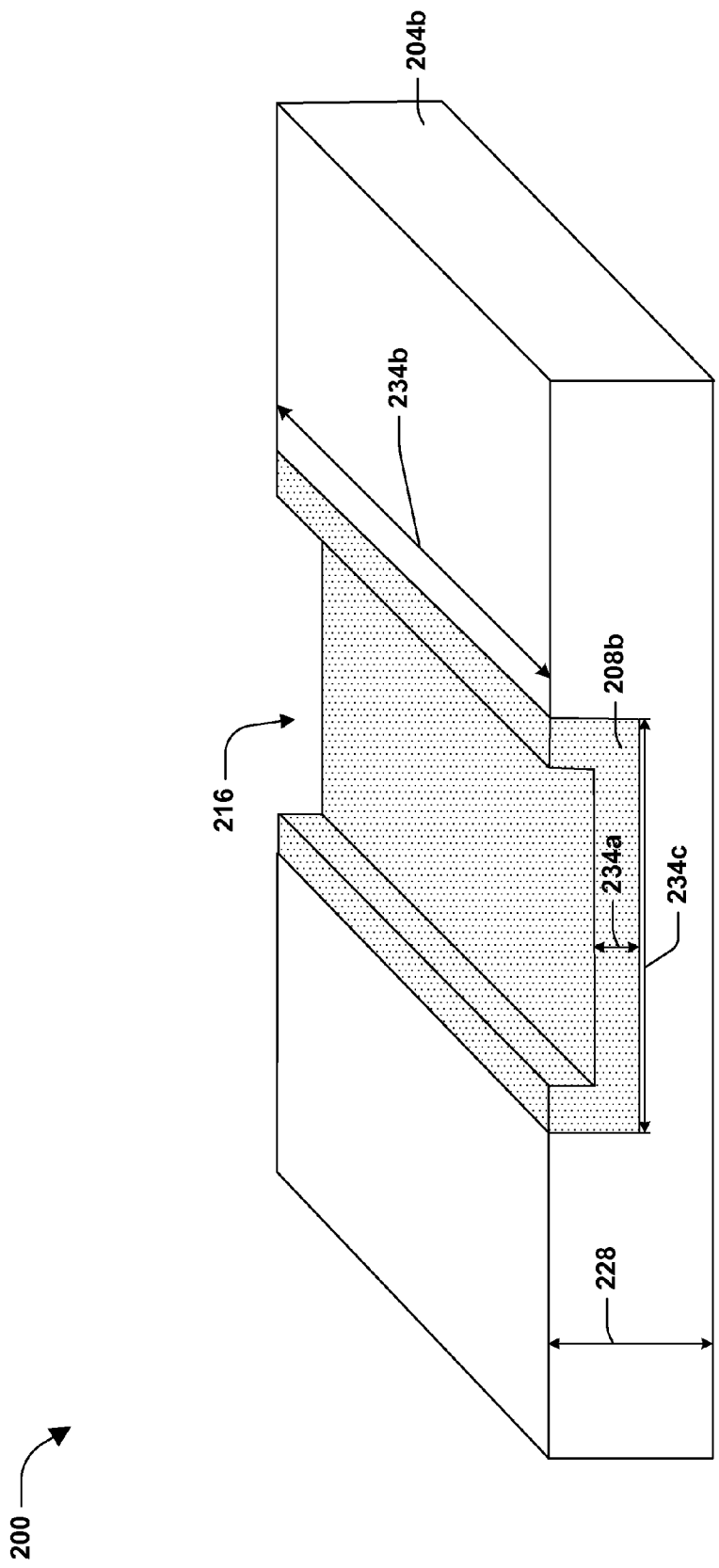
FIG. 8 is an illustration of a semiconductor arrangement, in accordance with some embodiments.

At 112 of method 100, as illustrated in FIG. 8, a second magnetic layer 208b is formed in a third opening 216 in a second upper dielectric layer 204b, according to some embodiments. In some embodiments, the second upper dielectric layer 204b has a second upper dielectric layer height 228 between about 100 µm to about 500 µm. In some embodiments, the third opening 216 is formed in substantially the same manner as described above with regard to the first opening 206, as illustrated in FIG. 3. In some embodiments, the second magnetic layer 208b is formed in substantially the same manner as described above with regard to the first magnetic layer 208a, as illustrated in FIG. 4. In some embodiments, the second magnetic layer 208b has a second magnetic layer thickness 234a that is substantially equal to the first magnetic layer thickness 218a. In some embodiments, the second magnetic layer 208b has a second magnetic layer width 234c that is substantially equal to the first magnetic layer width 218c. In some embodiments, the second magnetic layer 208b has a second magnetic layer length 234b that is substantially equal to the first magnetic layer length 218b.

At 114 of method 100, as illustrated in FIG. 9, a first upper dielectric layer 210b is formed in the third opening 216 over the second magnetic layer 208b to form a second composite 217, according to some embodiments. In some embodiments, the second composite 217 comprises the second upper dielectric layer 204b, the second magnetic layer 208b and the first upper dielectric layer 210b. In some embodiments, the first upper dielectric layer 210b is formed in substantially the same manner as described above with regard to the first lower dielectric layer 210a, as illustrated in FIG. 5. In some embodiments, the first upper dielectric layer 210b has a first upper dielectric layer thickness 230 as measured from the top wall 209d of the second magnetic layer 208b to a top surface 210*b*1 of the first upper dielectric layer 210*b*. In some embodiments, the first upper dielectric layer thickness 230 is substantially equal to the first lower dielectric layer distance 222*a*.

At 116 of method 100, as illustrated in FIG. 10, the second composite 217 is inverted and placed over the first composite 215 to form a third composite 219, according to some embodiments. In some embodiments, the second composite 217 is placed over the first composite 215, such that the first magnetic layer 208*a* and the second magnetic 208*b* are in contact. In some embodiments, the second composite 217 is placed over the first composite 215, such that a top surface 214*d* of the first transmission line 214 is in contact with the first upper dielectric layer 210*b*.

At 118 of method 100, as illustrated in FIG. 11, an anneal is performed on the third composite 219, according to some embodiments. In some embodiments, the anneal comprises applying a first temperature between about 500° C. to about 2,000° C. for a first duration between about 10 s to about 70 s. In some embodiments, the anneal forms the first dielectric layer 210 from the first upper dielectric layer 210*b* and the first lower dielectric layer 210*a*, such that the first dielectric layer 210 surrounds the first transmission line 214. In some embodiments, the anneal forms the magnetic layer 208 from the first magnetic layer 208*a* and the second magnetic layer 208*b*, such that the magnetic layer 208 surrounds the first dielectric layer 210. In some embodiments, the anneal forms the second dielectric layer 204 from the second upper dielectric layer 204*b* and the second lower dielectric layer 204*a*, such that the second dielectric layer 204 surrounds the magnetic layer 208. In some embodiments, the second dielectric layer 204 has a dielectric layer height 232 substantially equal to the sum of the second lower dielectric layer height 226 and the second upper dielectric layer height 228. In some embodiments, the magnetic layer 208 has a magnetic layer height 218*d* about 1.2 times to about 3 times the first transmission line height 220*a*. In some embodiments, the magnetic layer 208 surrounds the first transmission line 214, such that the first transmission line 214 is substantially equidistant from the first sidewall 209*b* of the magnetic layer 208, the second sidewall 209*c* of the magnetic layer 208, the top wall 209*d* of the magnetic layer 208 and the bottom wall 209*a* of the magnetic layer 208. In some embodiments, the semiconductor arrangement 200 having the magnetic layer 208 surrounding the first transmission line 214 has increased impedance without having increased resistance as compared to a semiconductor arrangement that does not have a magnetic layer. In some embodiments, increased resistance requires increased current or power, which results in a shorter semiconductor arrangement life span than the semiconductor arrangement 200 without the increased resistance.

According to some embodiments, the second composite 217 is formed in a similar manner as the first composite 215, such that an opening is formed in the first upper dielectric layer 210*b* and a transmission line is formed in the opening in the first upper dielectric layer 210*b*. When the second composite 217 is inverted and placed over the first composite 215 to form the third composite 219, the transmission line in the first upper dielectric layer 210*b* is aligned with and contacts the first transmission line in the first lower dielectric layer 210*a*. According to some embodiments, the transmission line in the first upper dielectric layer 210*b* has a height or thickness and the first transmission line in the first lower dielectric layer 210*a* has a height or thickness to cumulatively yield the height or thickness 220*a* illustrated in FIG. 11. According to some embodiments, the transmission line in the first upper dielectric layer 210*b* has a height or thickness approximately one half of 220*a* and the first transmission line in the first lower dielectric layer 210*a* has a height or thickness approximately one half of 220 to yield the height or thickness 220*a* when the second composite 217 is inverted and placed over the first composite 215.

According to some embodiments, a semiconductor arrangement comprises a first transmission line surrounded by a first dielectric layer. In some embodiments, a magnetic layer surrounds the first dielectric layer, the magnetic layer dimensioned relative to at least one of the first transmission line or the first dielectric layer to increase inductance of the first transmission line by a factor greater than 1. In some embodiments, a second dielectric layer surrounds the magnetic layer.

According to some embodiments, a method of forming a semiconductor arrangement comprises forming a first composite, forming a second composite inverting and placing the second composite over the first composite to form a third composite, such that a first magnetic layer and a second magnetic layer are in contact. In some embodiments, the forming the forming a first composite comprises forming a first opening in a second lower dielectric layer, forming a first magnetic layer in the first opening and forming a first lower dielectric layer in the first opening over the first magnetic layer. In some embodiments, the forming the forming a first composite comprises forming a second opening in the first lower dielectric layer and forming a first transmission line in the second opening. In some embodiments, the forming a second composite comprises forming a second magnetic layer in a third opening in a second upper dielectric layer and forming a first upper dielectric layer in the third opening over the second magnetic layer.

According to some embodiments, a semiconductor arrangement comprises a first transmission line comprising nickel surrounded by a first dielectric layer. In some embodiments, a magnetic layer surrounds the first dielectric layer, the magnetic layer dimensioned relative to at least one of the first transmission line or the first dielectric layer to increase inductance of the first transmission line by a factor greater than 1. In some embodiments, a second dielectric layer surrounds the magnetic layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement comprising:
a first transmission line having a first thickness and a first width, wherein:
the first thickness is different than the first width,
the first thickness is measured between a bottom wall of the first transmission line and a top wall of the first transmission line, and
the first width is measured between a first sidewall of the first transmission line and a second sidewall of the first transmission line;
a first dielectric layer surrounding the first transmission line and in contact with the top wall, the bottom wall, the first sidewall and the second sidewall of the first transmission line;
a magnetic layer surrounding the first dielectric layer; and
a second dielectric layer surrounding the magnetic layer and in contact with a top wall of the magnetic layer.

2. The semiconductor arrangement of claim 1, the first transmission line substantially equidistant from a first sidewall of the magnetic layer, a second sidewall of the magnetic layer, the top wall of the magnetic layer and a bottom wall of the magnetic layer.

3. The semiconductor arrangement of claim 1, the first transmission line comprising copper.

4. The semiconductor arrangement of claim 1, the magnetic layer comprising nickel.

5. The semiconductor arrangement of claim 1, at least one of:
the first dielectric layer having a dielectric constant less than 4; or
the second dielectric layer having a dielectric constant less than 4.

6. The semiconductor arrangement of claim 1, at least one of:
the first dielectric layer comprising at least one of a nitride or an oxide; or
the second dielectric layer comprising at least one of a nitride or an oxide.

7. The semiconductor arrangement of claim 1, the second dielectric layer over a substrate, the substrate having a reference voltage bias.

8. The semiconductor arrangement of claim 1, the first thickness less than about 100μm.

9. A semiconductor arrangement comprising:
a first transmission line having a first thickness and a first width, wherein:
the first thickness is different than the first width,
the first thickness is measured between a bottom wall of the first transmission line and a top wall of the first transmission line, and
the first width is measured between a first sidewall of the first transmission line and a second sidewall of the first transmission line;
a magnetic layer comprising nickel surrounding the first transmission line; and
a dielectric layer surrounding the magnetic layer.

10. The semiconductor arrangement of claim 9, the first transmission line substantially equidistant from a first sidewall of the magnetic layer, a second sidewall of the magnetic layer, a top wall of the magnetic layer and a bottom wall of the magnetic layer.

11. The semiconductor arrangement of claim 9, the first transmission line comprising copper.

12. The semiconductor arrangement of claim 9,
the dielectric layer having a dielectric constant less than 4.

13. The semiconductor arrangement of claim 9,
the dielectric layer comprising at least one of a nitride or an oxide.

14. The semiconductor arrangement of claim 9, comprising a second dielectric layer between the first transmission line and the magnetic layer, wherein a thickness of the second dielectric layer between the first transmission line and the magnetic layer at a first location is different than a thickness of the second dielectric layer between the first transmission line and the magnetic layer at a second location.

15. A semiconductor arrangement comprising:
a first transmission line having a first thickness and a first width, wherein:
the first thickness is different than the first width,
the first thickness is measured between a bottom wall of the first transmission line and a top wall of the first transmission line, and the first width is measured between a first sidewall of the first transmission line and a second sidewall of the first transmission line;

a first dielectric layer surrounding the first transmission line and extending along a length of the first transmission line; and a magnetic layer surrounding the first dielectric layer and the first transmission line, the magnetic layer extending along the length of the first transmission line, wherein a thickness of the first dielectric layer between the first transmission line and the magnetic layer at a first location is different than a thickness of the first dielectric layer between the first transmission line and the magnetic layer at a second location.

16. The semiconductor arrangement of claim 15, comprising:

a second dielectric layer surrounding the magnetic layer, the first dielectric layer, and the first transmission line.

17. The semiconductor arrangement of claim 16, the second dielectric layer in contact with the magnetic layer, the magnetic layer in contact with the first dielectric layer, and the first dielectric layer in contact with the first transmission line.

18. The semiconductor arrangement of claim 15, the magnetic layer comprising nickel.

19. The semiconductor arrangement of claim 15, the first transmission line comprising copper.

20. The semiconductor arrangement of claim 15, the magnetic layer in contact with the first dielectric layer and the first dielectric layer in contact with the first transmission line.

* * * * *